(12) United States Patent
Ker et al.

(10) Patent No.: US 7,817,386 B2
(45) Date of Patent: Oct. 19, 2010

(54) ESD PROTECTION CIRCUIT FOR IC WITH SEPARATED POWER DOMAINS

(75) Inventors: Ming-Dou Ker, Hsinchu (TW); Yuan-Wen Hsiao, Taichung (TW); Ryan Hsin-Chin Jiang, Taipei (TW)

(73) Assignee: Amazing Microelectronics Corp., Jhonghe, Taipei (TW)

( * ) Notice: Subject to any disclaimer, the term of this patent is extended or adjusted under 35 U.S.C. 154(b) by 485 days.

(21) Appl. No.: 11/907,206

(22) Filed: Oct. 10, 2007

(65) Prior Publication Data

US 2009/0097174 A1 Apr. 16, 2009

(51) Int. Cl.
*H02H 9/00* (2006.01)
(52) U.S. Cl. ....................................................... 361/56
(58) Field of Classification Search ..................... 361/56
See application file for complete search history.

(56) References Cited

U.S. PATENT DOCUMENTS

| 6,963,111 | B2 * | 11/2005 | Reddy et al. ................. 257/356 |
| 7,106,562 | B2 * | 9/2006 | Kitagawa ..................... 361/56 |
| 2004/0207021 | A1 * | 10/2004 | Russ et al. ................... 257/355 |
| 2006/0209478 | A1 * | 9/2006 | Arai et al. ..................... 361/56 |
| 2006/0262472 | A1 * | 11/2006 | Okushima .................. 361/91.1 |
| 2008/0062597 | A1 * | 3/2008 | Chen et al. .................... 361/56 |
| 2008/0144244 | A1 * | 6/2008 | Van Camp .................. 361/56 |

OTHER PUBLICATIONS

Ker et al., "ESD Protection Design to Overcome Internal Damage on Interface Circuits of a CMOS IC with Multiple Separated Power Pins", Sep. 2004, pp. 445-451, IEEE Transactions on Components and Packaging Technologies, vol. 27, No. 3.

* cited by examiner

*Primary Examiner*—Ronald W Leja
(74) *Attorney, Agent, or Firm*—Stites & Harbison, PLLC; Juan Carlos A. Marquez, Esq.

(57) ABSTRACT

An ESD protection circuit suitable for applying in an integrated circuit with separated power domains is provided. The circuit includes a P-type MOSFET coupled between a first circuit in a first power domain and a second circuit in a second power domain. A source terminal of the P-type MOSFET is coupled to a connection node for connecting the first circuit and the second circuit. A gate terminal of the P-type MOSFET is coupled to a positive power line of the second power domain. A drain terminal of the P-type MOSFET is coupled to a negative power line of the second power domain. A body terminal of the P-type MOSFET is also coupled to the connection node.

9 Claims, 11 Drawing Sheets

US 7,817,386 B2

ESD PROTECTION CIRCUIT FOR IC WITH SEPARATED POWER DOMAINS

BACKGROUND OF THE INVENTION

1. Field of the Invention

The present invention relates to an electrostatic discharge (ESD) protection circuit. In particular, the present invention relates to an ESD protection circuit suitable for applying in an integrated circuit (IC) with separated power domains.

2. Description of the Prior Art

ESD is one of the most important reliability issues for IC products, which must be taken into consideration during the design phase of all ICs. With the advance of IC fabrication technologies, more and more circuit blocks are integrated in a single chip. In such a system-on-chip (SoC) application, the interface circuits in ICs with separated power domains are often damaged by ESD stresses.

A variety of ESD detection circuits for ICs with separated power domains were proposed. FIG. 1 and FIG. 2 respectively illustrate the traditional ESD protection circuits. In FIG. 1, the labels VDD1 and VSS1 represent power rails in a first power domain; VDD2 and VSS2 represent power rails in a second power domain. The PMOS $M_{PESD}$ and the NMOS $M_{NESD}$ are used to protect the interface circuits between the two power domains.

Generally, ESD occurs when one pin of an IC is grounded and another pin of the IC contacts an electrostatically precharged object. In the circuit of FIG. 1, when VDD1 is zapped by a positive ESD stress with VSS2 grounded, the ESD energy will be conducted to the gate terminals of $M_{P2}$ and $M_{N2}$ through $M_{P1}$. $M_{NESD}$, which is a gate-grounded NMOS (GGNMOS), will be turned on to clamp the gate potential of $M_{N2}$. Therefore, $M_{N2}$ can be protected against ESD damages.

For the circuit in FIG. 1, when VDD1 is zapped by a positive ESD stress with VDD2 grounded, the parasitic P+/N-well diode (between the signal line and VDD2) in $M_{PESD}$ will clamp the gate potential of $M_{P2}$ to protect $M_{P2}$ against ESD damages. Similarly, when VSS1 is zapped by a negative ESD stress with VSS2 grounded, the parasitic N+/P-well diode (between VSS2 and the signal line) in $M_{NESD}$ will clamp the gate potential of $M_{N2}$ to protect $M_{N2}$ against ESD damages. Further, when VSS1 is zapped by a negative ESD stress with VDD2 grounded, the gate-VDD PMOS (GDPMOS) $M_{PESD}$ will be turned on to clamp the gate potential of $M_{P2}$. Therefore, $M_{P2}$ can be protected against ESD damages.

In FIG. 2, two diodes $D_P$ and $D_N$ are used to protect $M_{P2}$ and $M_{N2}$. When the ESD overstress voltage appears at the gate terminals of $M_{P2}$ and $M_{N2}$, $D_P$ and $D_N$ will clamp the voltage across the gate oxides of $M_{P2}$ and $M_{N2}$. With the power-rail ESD clamp circuit between VDD2 and VSS2, $M_{P2}$ and $M_{N2}$ can be protected against ESD damages.

FIG. 3 illustrates an ESD protection circuit proposed in "ESD protection design to overcome internal damages on interface circuits of a CMOS IC with multiple separated power pins" reported by M.-D. Ker, C.-Y. Chang, and Y.-S. Chang in IEEE Trans. Components and Packaging Technologies, vol. 27, no. 3, pp. 445-451, September 2004. In this circuit, two ESD clamp devices $M_{NESD1}$ and $M_{NESD2}$ are placed between VDD2 and the signal line, and between the signal line and VSS2, respectively.

When VSS1 is zapped by a negative ESD stress with VDD2 grounded, $M_{NESD1}$ will be turned on to clamp the gate potential of $M_{P2}$. When VSS1 is zapped by a negative ESD stress with VSS2 grounded, the parasitic N+/P-well diodes (between VSS2 and the signal line) in $M_{NESD1}$ and $M_{NESD2}$ will clamp the gate potential of $M_{N2}$ to protect $M_{N2}$. The gate terminal of $M_{NESD1}$ is connected to its source terminal, so $M_{NESD1}$ is turned off under normal circuit operating conditions.

When VDD1 is zapped by a positive ESD stress with VSS2 grounded, the GGNMOS $M_{NESD2}$ will be turned on to clamp the gate potential of $M_{N2}$ to protect $M_{N2}$ against ESD damages. When VDD1 is zapped by a positive ESD stress with VDD2 grounded, $M_{NESD1}$ will act as a diode-connected NMOS to clamp the gate potential of $M_{P2}$.

SUMMARY OF THE INVENTION

The invention provides several new ESD protection circuits for ICs with separated power domains. The first embodiment according to the invention is an ESD protection circuit including a P-type MOSFET. The P-type MOSFET is coupled between a first circuit in a first power domain and a second circuit in a second power domain. The source terminal of the P-type MOSFET is coupled to a connection node for connecting the first circuit and the second circuit. The gate terminal of the P-type MOSFET is coupled to a positive power line of the second power domain. The drain terminal of the P-type MOSFET is coupled to a negative power line of the second power domain. The body terminal of the P-type MOSFET is also coupled to the connection node.

The second embodiment according to the invention is an ESD protection circuit including a detection unit and a discharging unit. The detection unit is configured in a first power domain. The discharging unit is configured in a second power domain and coupled to the detection unit. The discharging unit is turned off during normal power operations and triggered by the detection unit in an ESD event.

The advantage and spirit of the invention may be understood by the following recitations together with the appended drawings.

BRIEF DESCRIPTION OF THE APPENDED DRAWINGS

Figure 1:
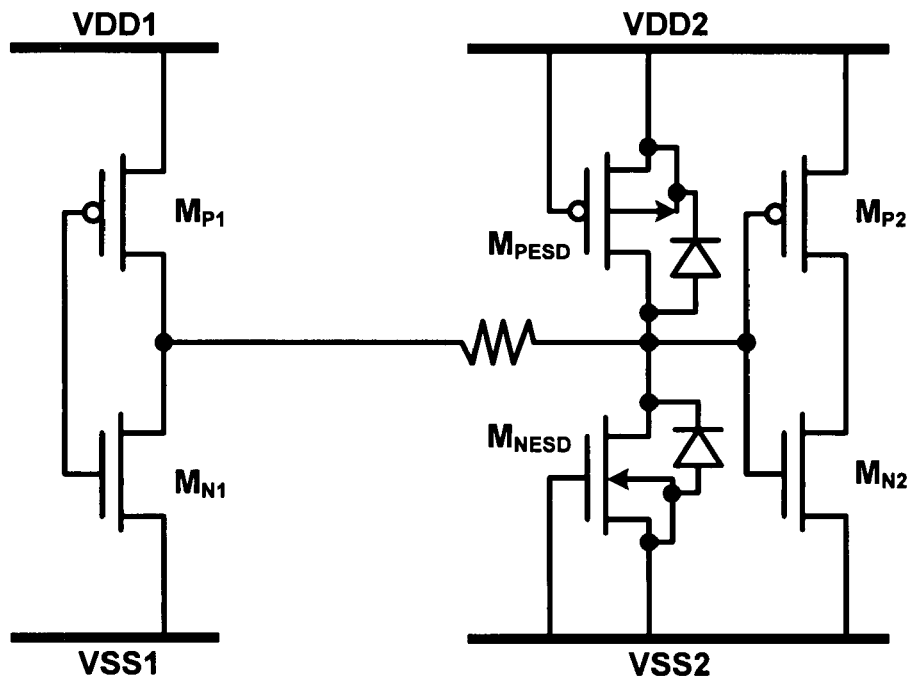
FIG. 1 through FIG. 3 show several ESD circuits disclosed in prior arts.
Figure 2:
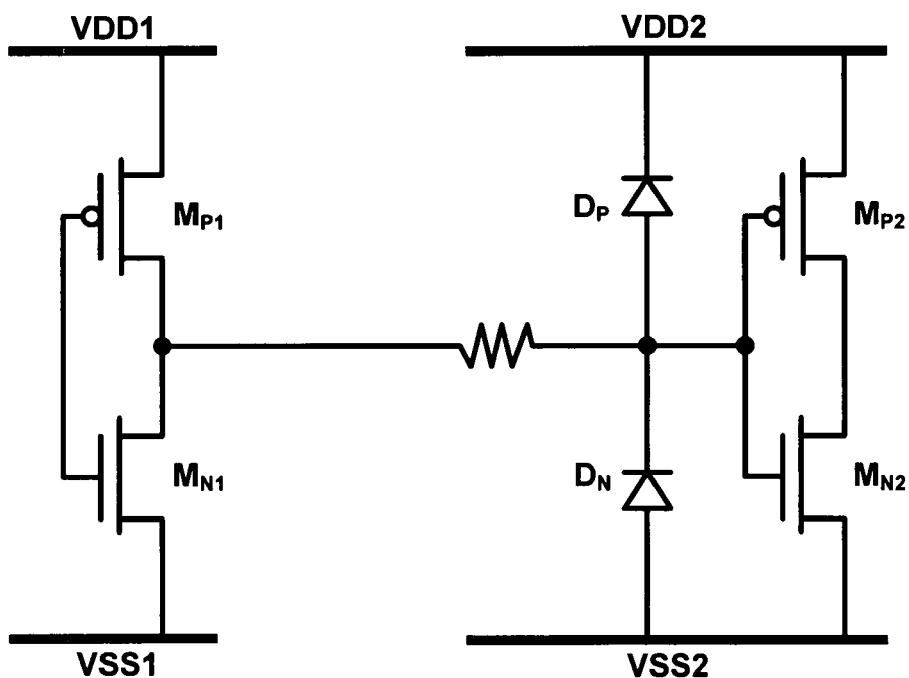
Figure 3:
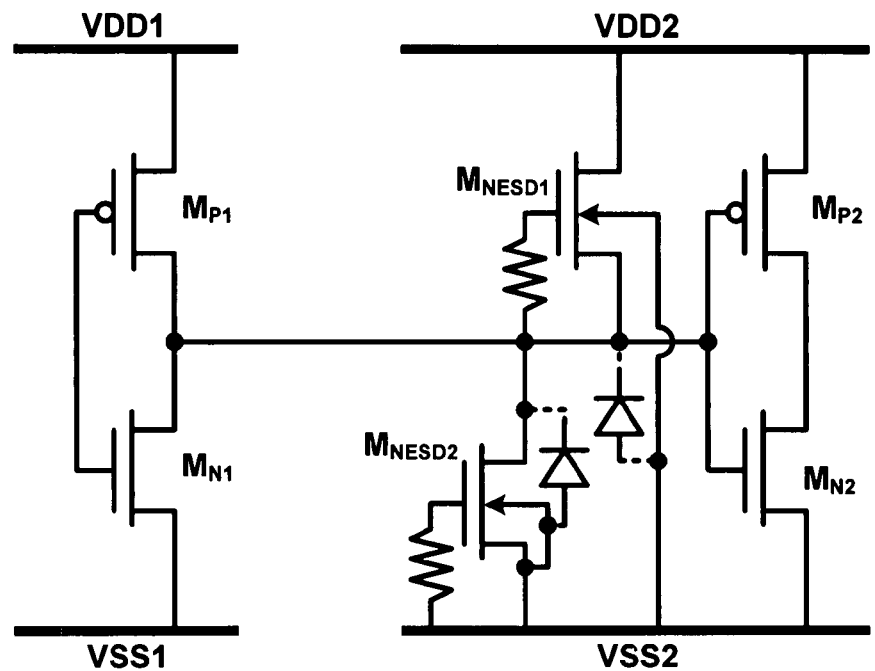
Figure 4:
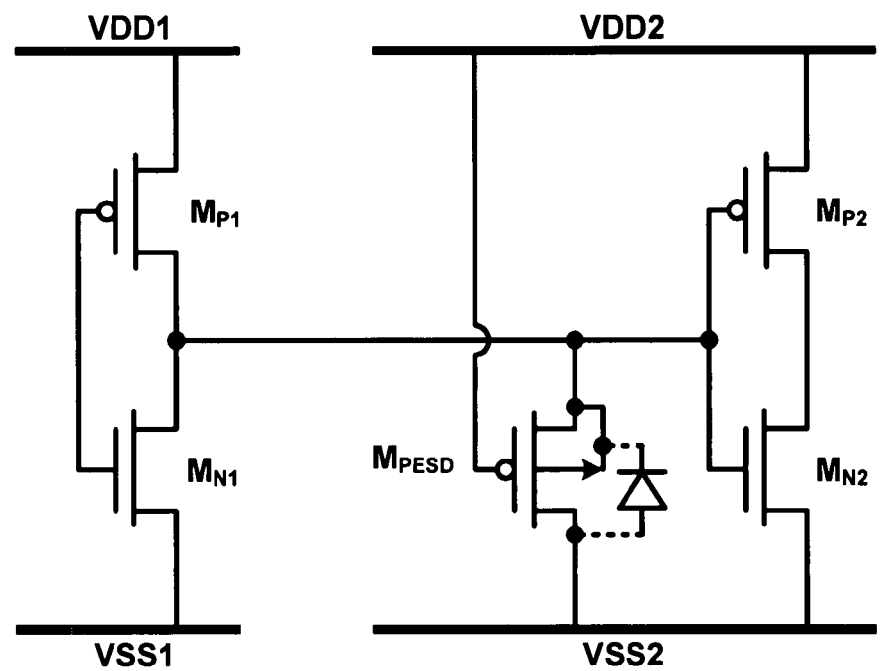
FIG. 4 illustrates the ESD protection circuit in the first embodiment according to the invention.
Figure 5:
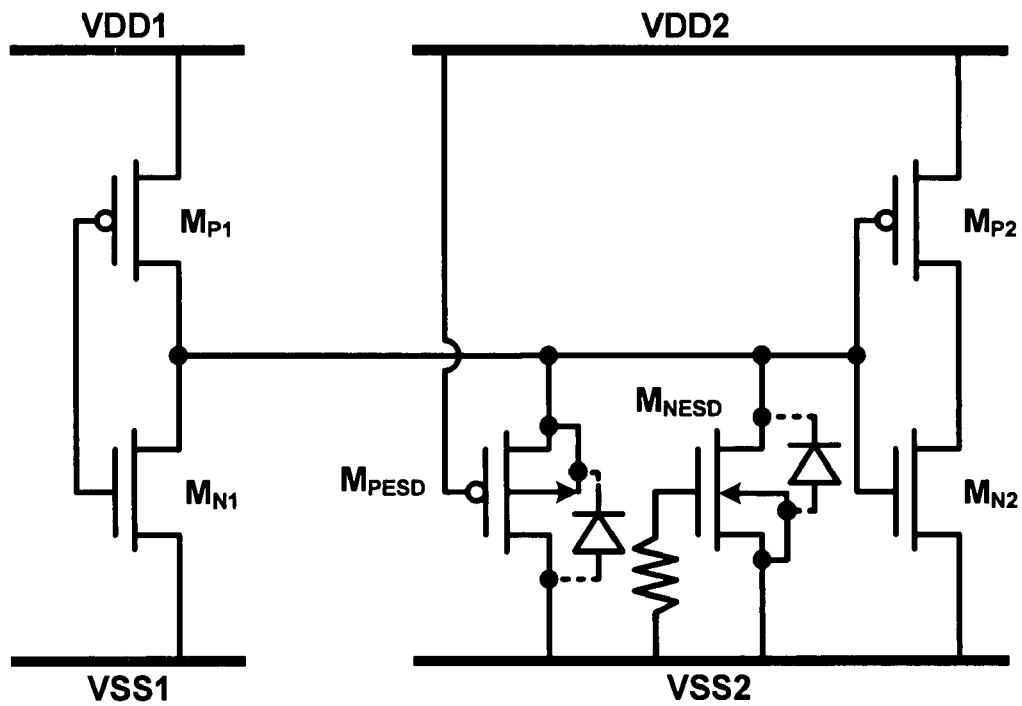
Figure 6:
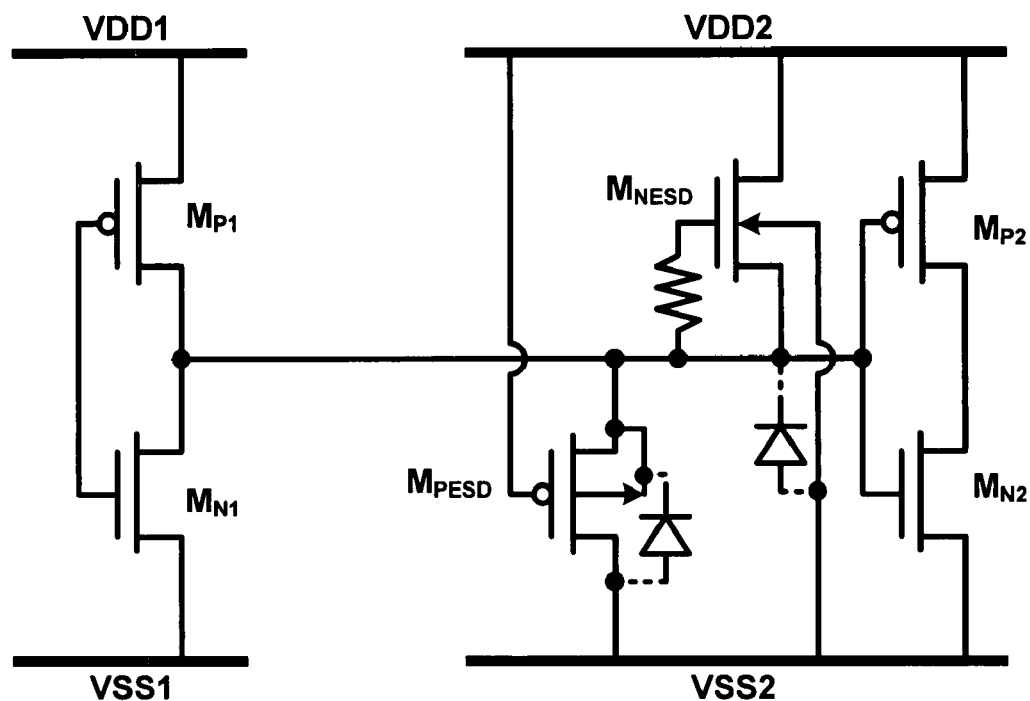
Figure 7A:
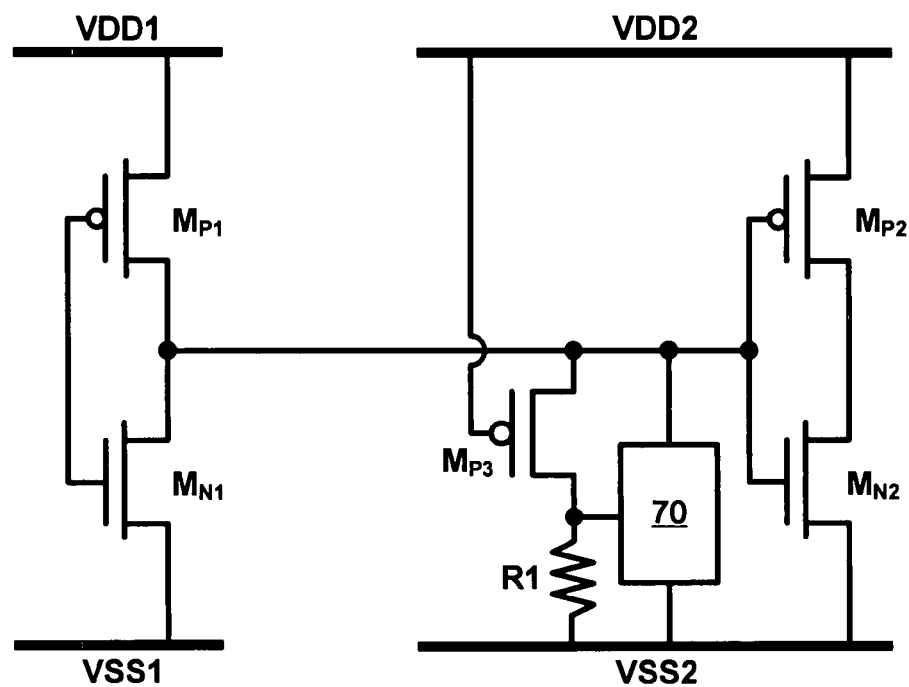
Figure 7B:
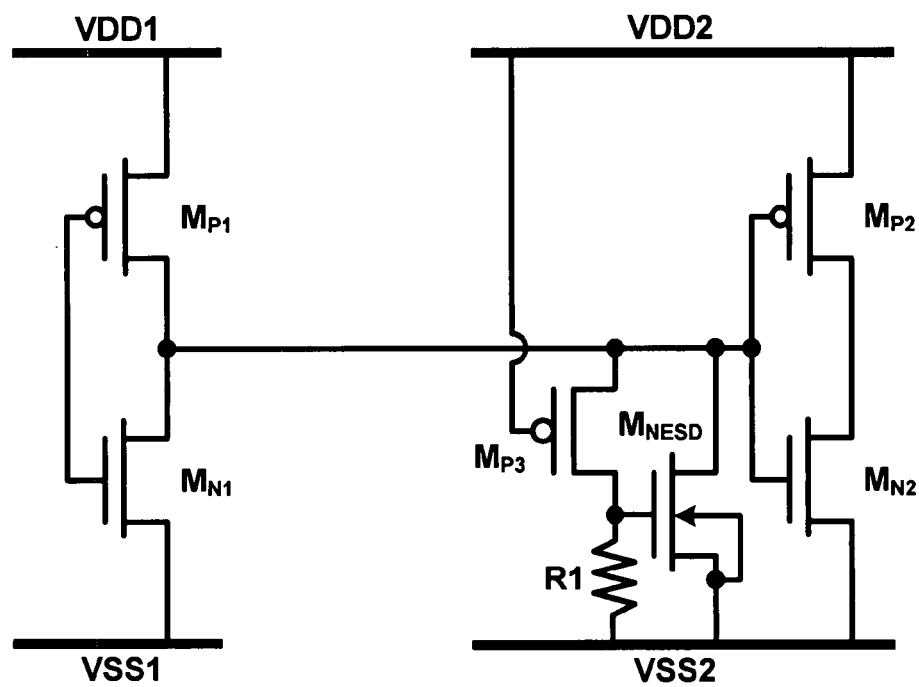
Figure 7C:
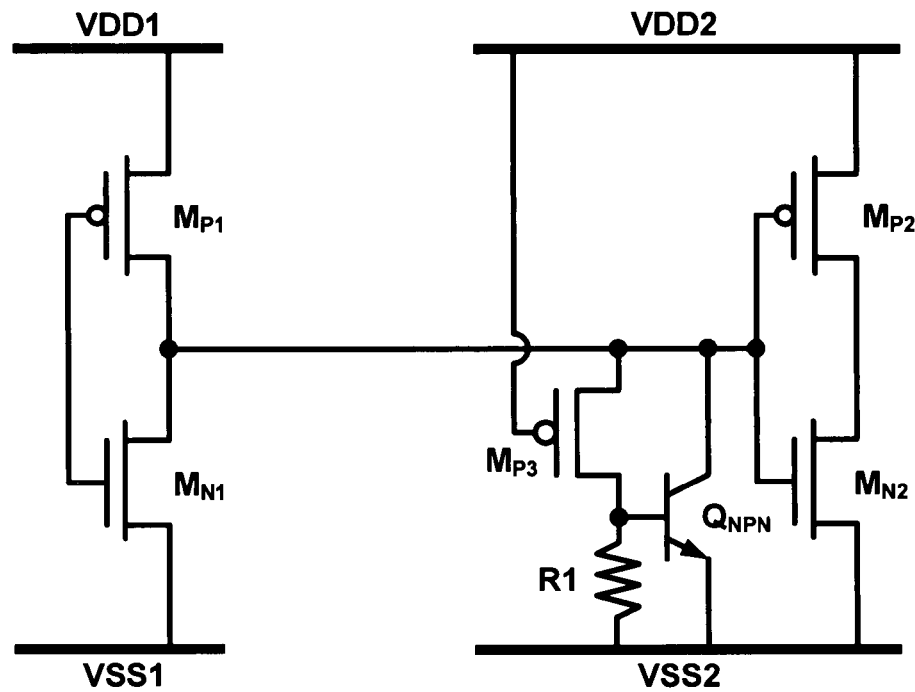
Figure 7D:
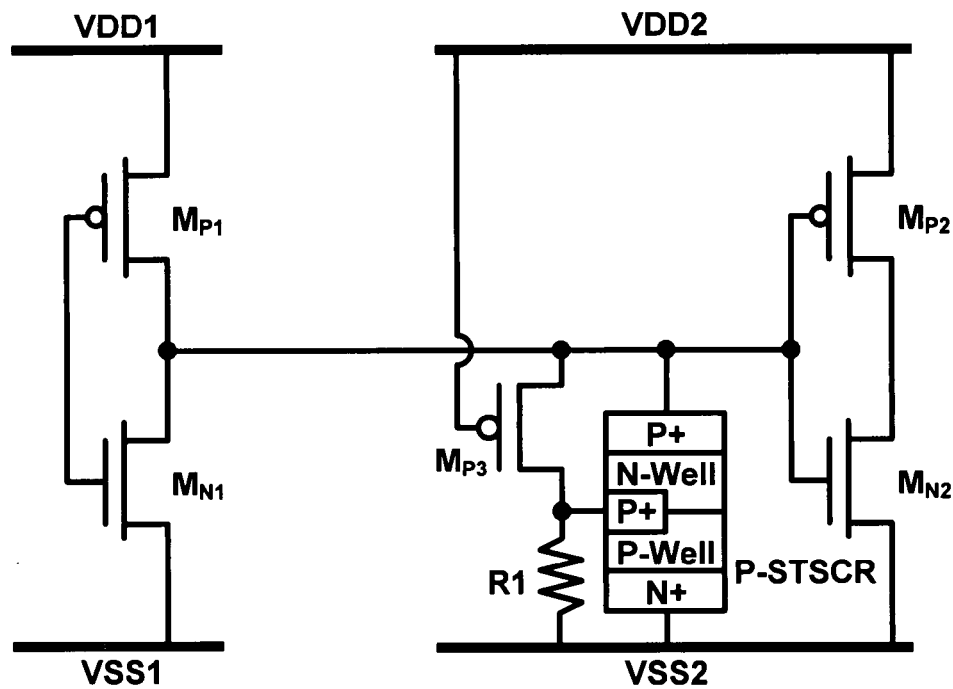
Figure 7E:
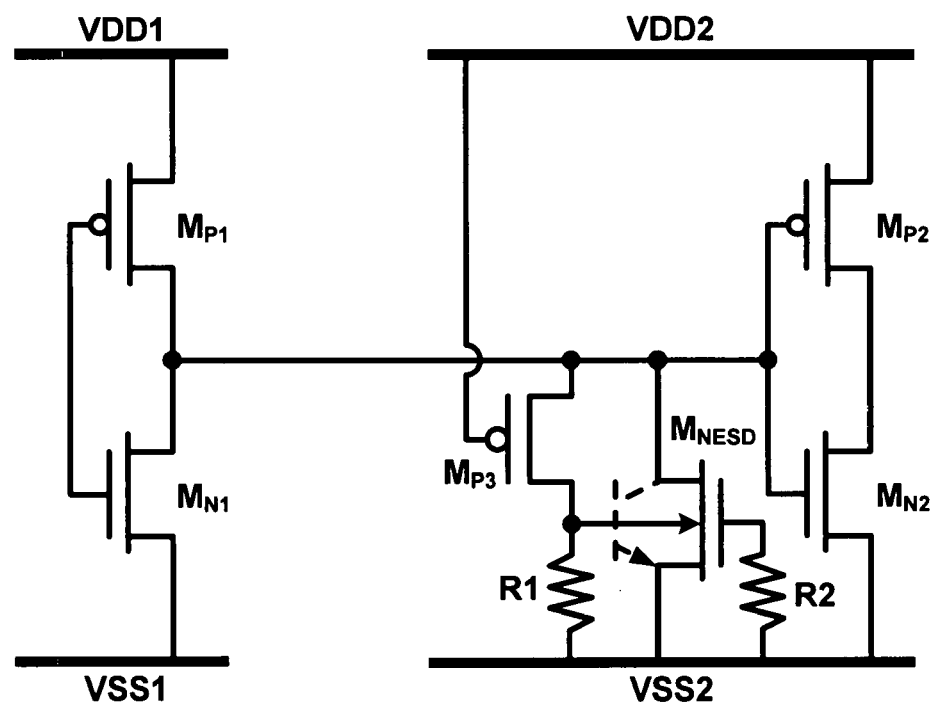

FIG. 5, FIG. 6, and FIG. 7(A) show embodiments based on the circuit in FIG. 4.

FIG. 7(B) through FIG. 7(E) illustrate several examples of the discharging component in FIG. 7(A).

Figure 8:
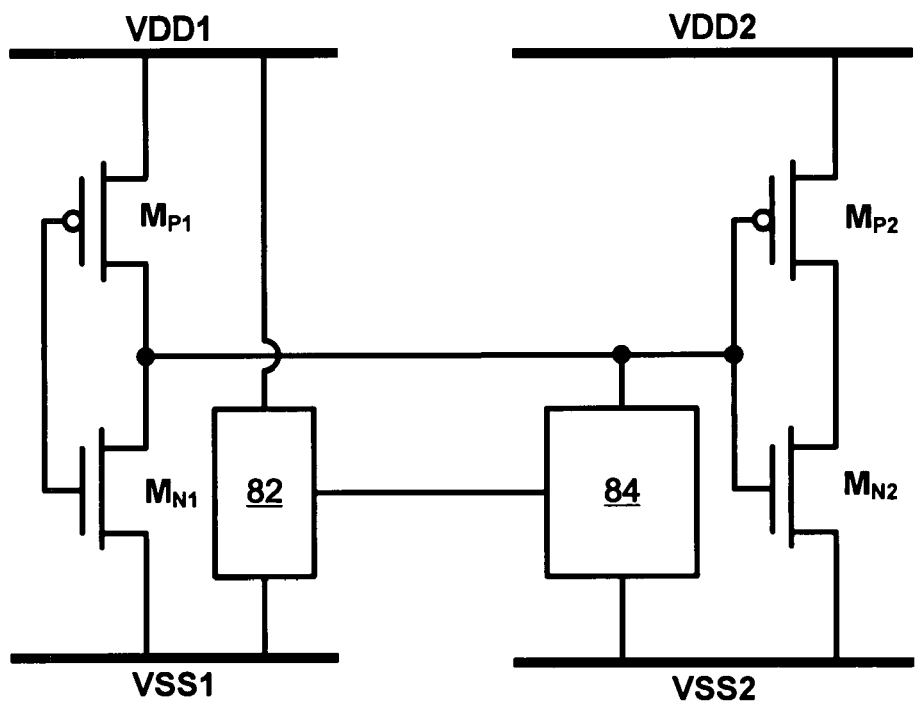

FIG. 8 illustrates the ESD protection circuit in the second embodiment according to the invention.

FIG. 9 through FIG. 14(C) show plural exemplary circuits of the detection unit and the discharging unit according to the invention.

DETAILED DESCRIPTION OF THE INVENTION

Please refer to FIG. 4, which illustrates the ESD protection circuit in the first embodiment according to the invention. In this embodiment, the ESD protection circuit includes a PMOS ($M_{PESD}$). The labels VDD1 and VSS1 represent power rails in a first power domain; VDD2 and VSS2 represent power rails in a second power domain. As shown in FIG. 4, $M_{PESD}$ is coupled between a first circuit ($M_{P1}$, $M_{N1}$) in the first power domain and a second circuit ($M_{P2}$, $M_{N2}$) in the second power domain.

The source and body terminals of $M_{PESD}$ are coupled to a connection node for connecting the first circuit and the second circuit. The gate terminal of $M_{PESD}$ is coupled to VDD2.

The drain terminal of $M_{PESD}$ is coupled to VSS2. In actual applications, the gate terminal of $M_{PESD}$ can be coupled to VDD2 via a resistor (not shown).

$M_{PESD}$ is used to clamp the voltage across the gate oxides of $M_{P2}$ and $M_{N2}$. When VDD1 is zapped by a positive ESD stress with VSS2 grounded, the ESD energy will be conducted to the gate terminals of $M_{P2}$ and $M_{N2}$ through $M_{P1}$. Since the gate terminal of $M_{PESD}$ is connected to VDD2, which is floating in this ESD condition, $M_{PESD}$ will be turned on when the ESD overstress voltage appears at the gate terminals of $M_{P2}$ and $M_{N2}$. Therefore, the gate voltage and $M_{N2}$ will be clamped by $M_{PESD}$ under this ESD condition. Moreover, since VDD2 is biased under normal circuit operating conditions, $M_{PESD}$ will not be turned on to degrade the signal.

When VSS1 is zapped by a negative ESD stress with VSS2 grounded, the parasitic P+/N-well diode (between VSS2 and the connection node) in $M_{PESD}$ will clamp the gate potential of $M_{N2}$ to protect $M_{N2}$ against ESD damages.

FIG. 5 shows an embodiment based on the circuit in FIG. 4. Compared to the embodiment in FIG. 4, the ESD protection circuit in FIG. 5 further includes an N MOS ($M_{NESD}$) to provide additional protection. The drain terminal of $M_{NESD}$ is coupled to the connection node. The other terminals (gate, source, and body) of $M_{NESD}$ are coupled to VSS2. As shown in FIG. 5, the gate terminal of $M_{NESD}$ can be coupled to VSS2 via a resistor.

When VDD1 is zapped by a positive ESD stress with VSS2 grounded, $M_{NESD}$ will be turned on to clamp the gate voltage of $M_{N2}$. When VSS1 is zapped by a negative ESD stress with VSS2 grounded, the parasitic N+/P-well diode (between VSS2 and the connection node) in $M_{NESD}$ will clamp the gate potential of $M_{N2}$ to protect $M_{N2}$ against ESD damages.

FIG. 6 shows another embodiment based on the circuit in FIG. 4. Compared to the embodiment in FIG. 4, the ESD protection circuit in FIG. 6 also further includes a clamp NMOS ($M_{NESD}$) to provide additional protection. In this embodiment, the drain terminal of $M_{NESD}$ is coupled to VDD2. The gate and source terminals of $M_{NESD}$ are both coupled to the connection node. The body terminal of $M_{NESD}$ is coupled to VSS2. As shown in FIG. 6, the gate terminal of $M_{NESD}$ can be coupled to the connection node via a resistor.

The function of $M_{PESD}$ in FIG. 6 is the same as that in FIG. 4. When VDD1 is zapped by a positive ESD stress with VSS2 grounded, $M_{PESD}$ will be turned on to clamp the gate voltage of $M_{N2}$. When VDD1 is zapped by a positive ESD stress with VDD2 grounded, $M_{NESD}$ will act as a diode-connected NMOS to protect $M_{P2}$. When VSS1 is zapped by a negative ESD stress with VDD2 grounded, $M_{NESD}$ will be turned on to clamp the gate potential of $M_{P2}$. When VSS1 is zapped by a negative ESD stress with VSS2 grounded, the parasitic P+/N-well diode (between VSS2 and the connection node) in $M_{PESD}$ and the parasitic N+/P-well diode (between VSS2 and the connection node) in $M_{NESD}$ will clamp the gate potential of $M_{N2}$ to protect $M_{N2}$.

FIG. 7(A) shows another embodiment based on the circuit in FIG. 4. In this embodiment, the drain terminal of $M_{P3}$ is coupled to VSS2 via a first resistor (R1). And, the ESD protection circuit further includes a discharging component 70 coupled between the connection node and VSS2. As shown in FIG. 7(A), the discharging component 70 has a trigger terminal coupled to the node between $M_{P3}$ and R1. Through the trigger terminal, the discharging component 70 is turned off during normal power operations and triggered by $M_{P3}$ in an ESD event.

FIG. 7(B) through FIG. 7(E) illustrates several examples of the discharging component 70. As shown in these figures, the discharging component 70 can be one selected from the group consisting of: an NMOS with its gate as the trigger terminal, an NPN BJT, a P-type substrate-triggered SCR, and an NMOS with its body as the trigger terminal and its gate coupled to VSS2 via a second resistor (R2).

Please refer to FIG. 8, which illustrates the ESD protection circuit in the second embodiment according to the invention. In this embodiment, the ESD protection circuit includes a detection unit 82 and a discharging unit 84. The detection unit 82 is configured in the first power domain (VDD1, VSS1). The discharging unit 84 is configured in the second power domain (VDD2, VSS2) and coupled to the detection unit 82. The discharging unit 84 is turned off during normal power operations and triggered by the detection unit 82 in an ESD event.

Figure 9:
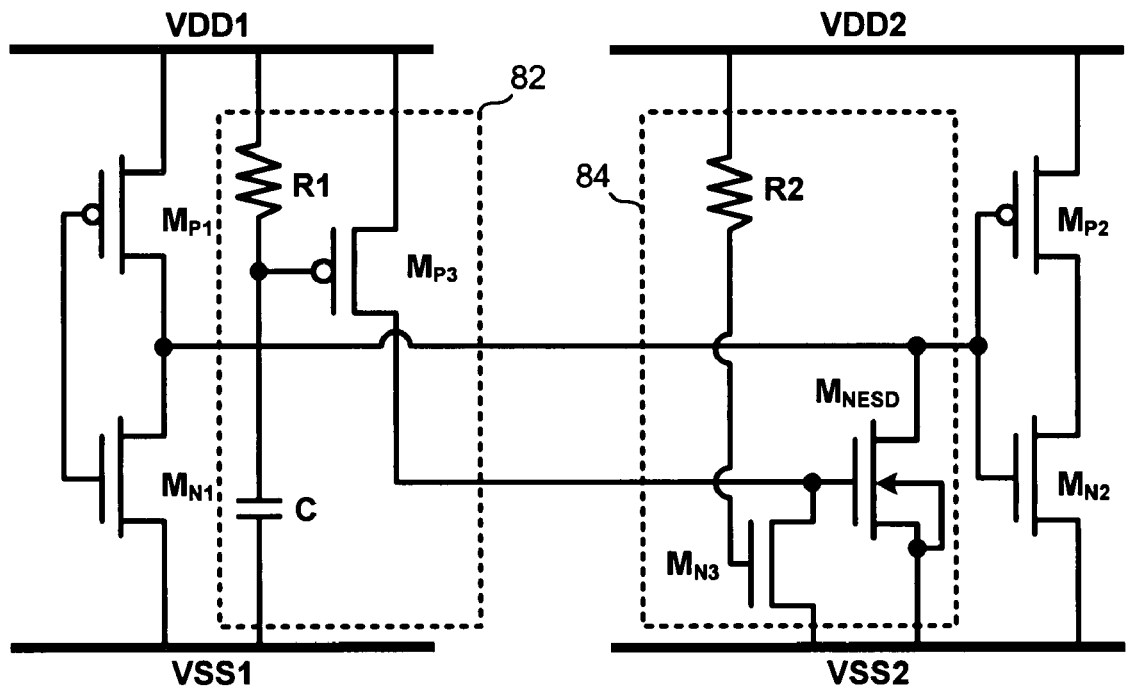

FIG. 9 shows an exemplary circuit of the detection unit 82 and the discharging unit 84. In this example, the detection unit 82 includes a capacitor (C), a first resistor (R1), and a PMOS ($M_{P3}$). The capacitor and the first resistor are formed in series between VDD1 and VSS1. As shown in FIG. 9, the gate terminal of $M_{P3}$ is coupled to the node between C and R1. The source terminal of $M_{P3}$ is coupled to VDD1. The drain terminal of $M_{P3}$ is coupled to and used for triggering the discharging unit 84.

Also as shown in FIG. 9, the discharging unit 84 includes a second resistor (R2) and two NMOSs ($M_{NESD}$ and $M_{N3}$). The drain terminal of $M_{NESD}$ is coupled to a connection node for connecting the first circuit ($M_{P1}$, $M_{N1}$) and the second circuit ($M_{P2}$, $M_{N2}$). The gate terminal of $M_{NESD}$ is coupled to the drain terminal of $M_{P3}$. The source terminal of $M_{NESD}$ is coupled to VSS2. The drain terminal of $M_{N3}$ is coupled to the drain terminal of $M_{P3}$. The gate terminal of $M_{N3}$ is coupled to VDD2 via R2. The source terminal of $M_{N3}$ is coupled to VSS2.

In the example shown in FIG. 9, $M_{P3}$ is used to turn on $M_{NESD}$ under ESD conditions. When VDD1 is zapped by a positive ESD stress with VSS2 grounded, $M_{P3}$ will be turned on to boost the gate voltage of $M_{NESD}$ due to the RC delay. Therefore, $M_{NESD}$ will be turned on to protect $M_{N2}$. The function of $M_{N3}$ is turning off $M_{NESD}$ during normal circuit operations.

Figure 10:
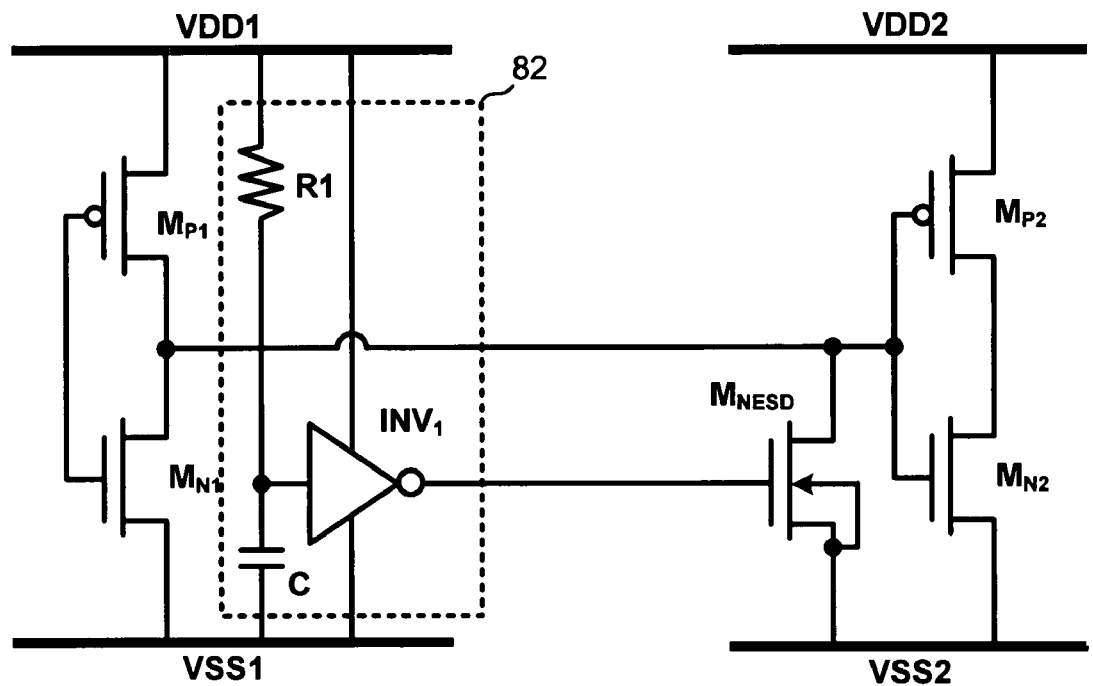

Since $M_{N3}$ in FIG. 9 is turned on under normal circuit operating conditions, $M_{P3}$ and $M_{N3}$ can be combined as an inverter ($INV_1$), as shown in FIG. 10. Moreover, $INV_1$ can be viewed as a triggering component. The triggering component has a positive power end coupled to VDD1 and a negative power end coupled to VSS1. An input of the triggering component is coupled to a node between R1 and C. An output of the triggering component is coupled to and used for triggering the discharging unit 84.

In actual applications, $INV_1$ can be replaced by an M-input NAND with all inputs coupled together or an N-input NOR with all inputs coupled together. Herein, M and N are positive integers larger than 1, respectively.

In the embodiment of FIG. 10, the discharging unit 84 is an NMOS ($M_{NESD}$). When VDD1 is zapped by a positive ESD stress with VSS2 grounded, the PMOS in $INV_1$ will be turned on to boost the gate voltage of $M_{NESD}$ due to the RC delay. Therefore, $M_{NESD}$ will be turned on to protect $M_{N2}$. The NMOS in $INV_1$ is turned on to turn off $M_{NESD}$ under normal circuit operating conditions.

Figure 11:
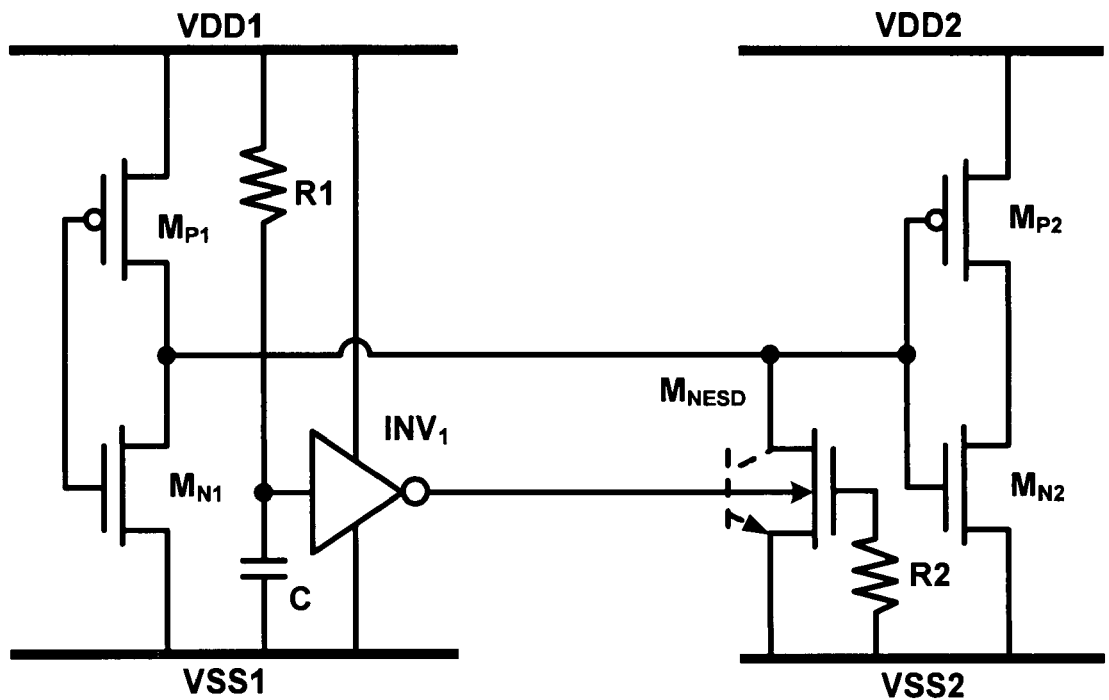

Please refer to FIG. 11, which illustrates an embodiment similar to that in FIG. 10. The discharging unit 84 in this embodiment is also an NMOS ($M_{NESD}$). However, in this embodiment, the body terminal of $M_{NESD}$ is coupled to the output of $INV_1$. The gate terminal of $M_{NESD}$ is coupled to the second negative power line via a resistor (R2). In this embodiment, $M_{NESD}$ can provide similar functions as that in FIG. 10.

Figure 12A:
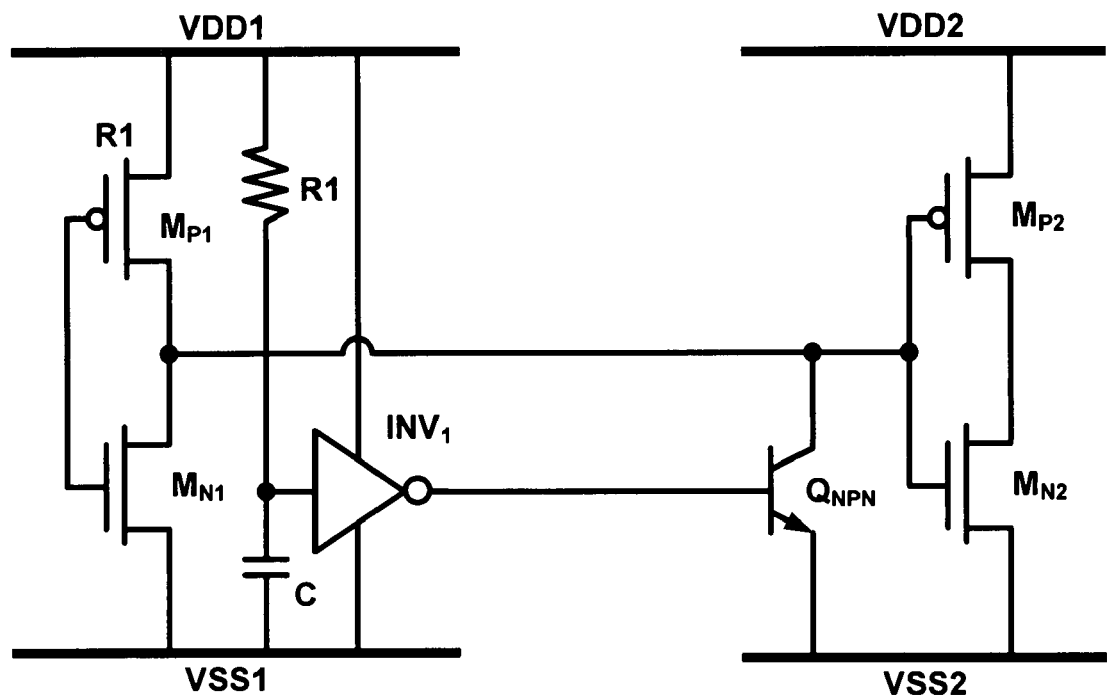
Figure 12B:
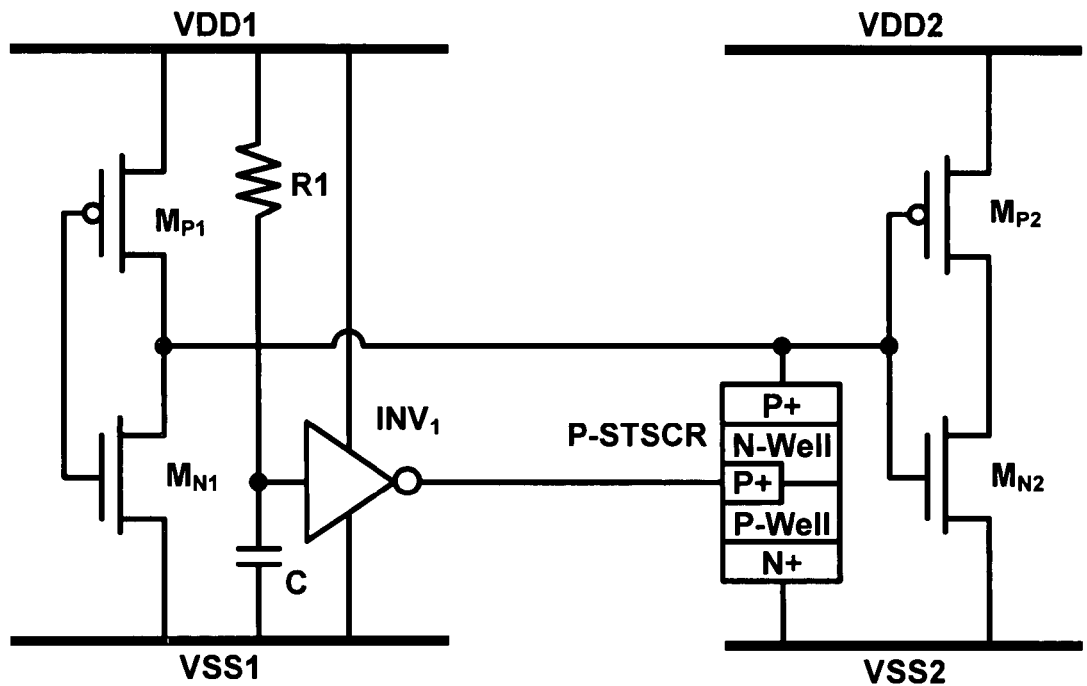

Furthermore, as shown in FIG. 12(A) and FIG. 12(B), $M_{NESD}$ can also be replaced by an NPN BJT or a P-type substrate-triggered SCR.

Figure 13:
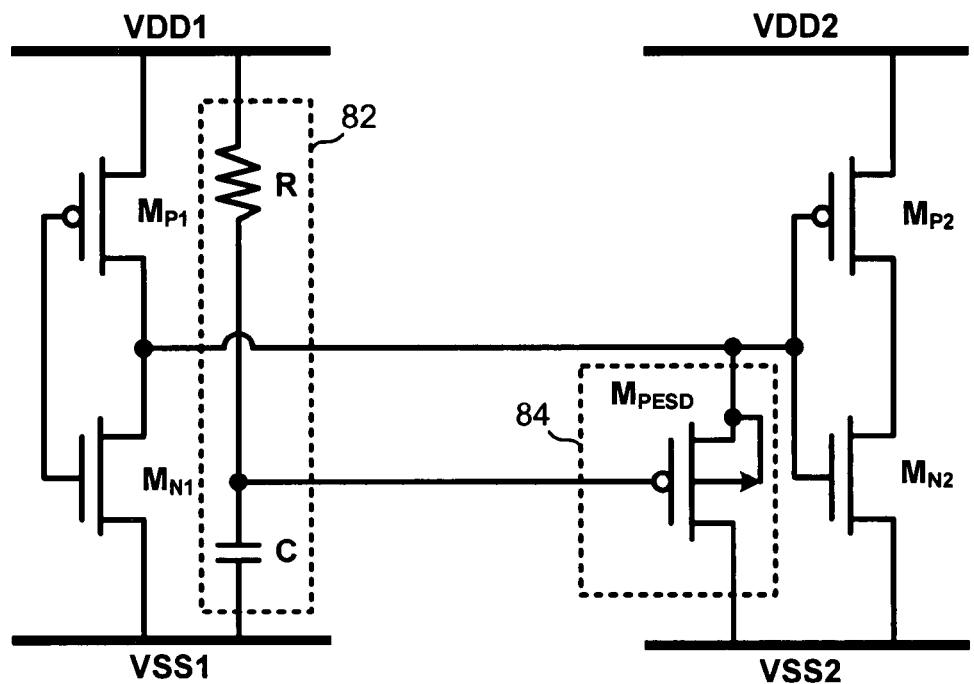

FIG. 13 shows another exemplary circuit of the detection unit 82 and the discharging unit 84. In FIG. 13, the detection unit 82 is formed by a resistor (R) and a capacitor (C) coupled in series between VDD1 and VSS1. The RC circuit is used to control the discharging unit 84, $M_{PESD}$. Under normal circuit operating conditions, the RC circuit sends the VDD1 voltage to the gate terminal of $M_{PESD}$ to turn off $M_{PESD}$. When VDD1 is zapped by a positive ESD stress with VSS2 grounded, $M_{PESD}$ will be turned on to clamp the gate voltage of $M_{N2}$ due to the RC delay. Therefore, $M_{N2}$ can be protected under ESD conditions.

Figure 14A:
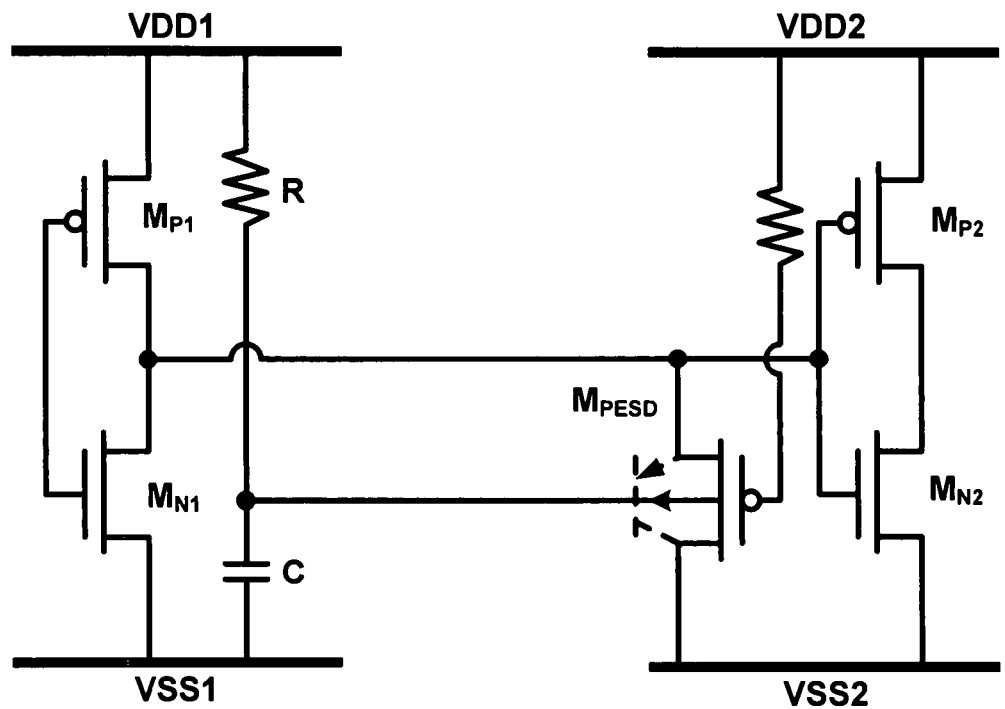
Figure 14B:
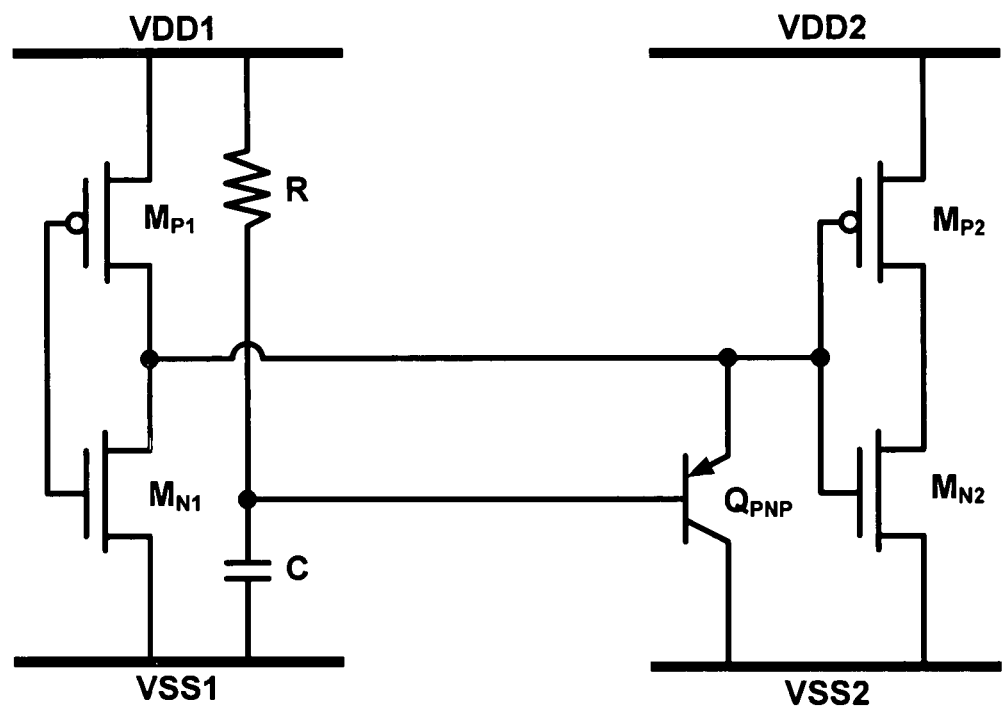
Figure 14C:
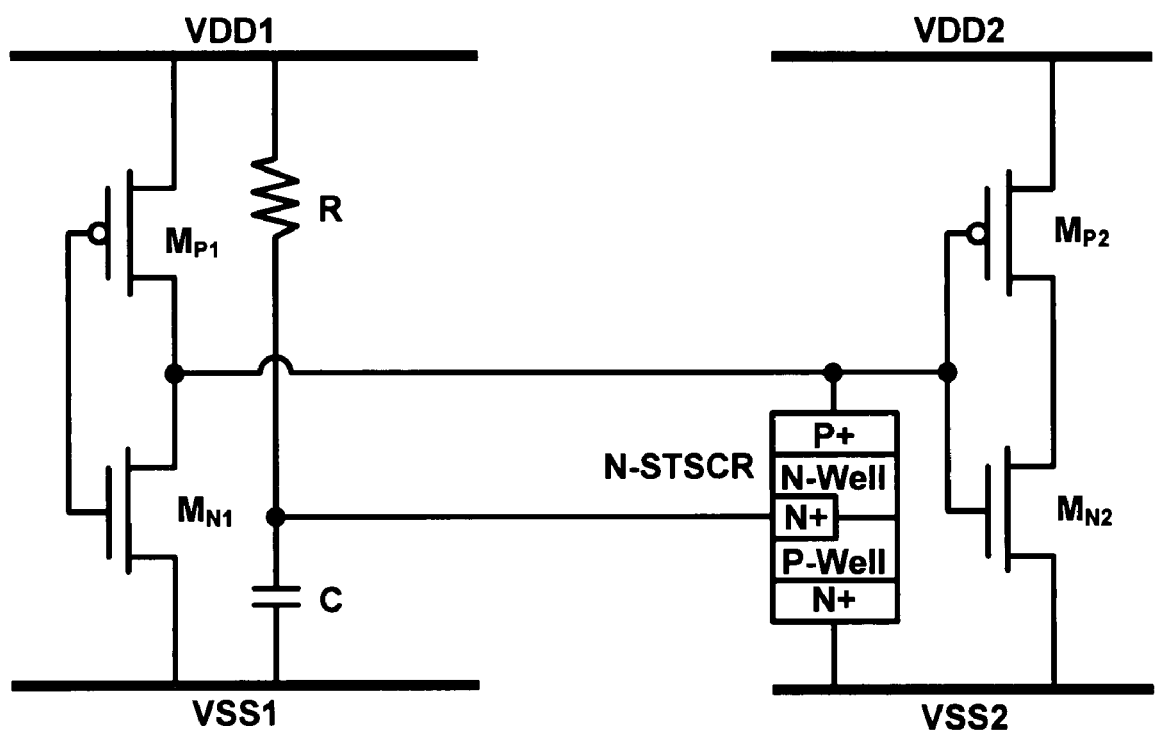

As shown in FIG. 14(A), the ESD clamp device $M_{PESD}$ in FIG. 13 can be replaced by a PMOS with its gate coupled to VDD2 via a resistor (R2) and its body coupled to the node between R1 and C. Further, as shown in FIG. 14(B) and FIG. 14(C), the ESD clamp device $M_{PESD}$ in FIG. 13 can also be replaced by a PNP BJT or an N-type substrate-triggered SCR.

In this invention, several new ESD protection circuits are proposed. All the circuits can effectively provide ESD protection functions for interface circuits between different power domains.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An electrostatic discharge (ESD) protection circuit, comprising:
    a detection unit configured in a first power domain; and
    a discharging unit configured in a second power domain and coupled to the detection unit, the discharging unit being turned off during normal power operations and triggered by the detection unit in an ESD event,
    wherein the first power domain has a first positive power line and a first negative power line, and the detection unit comprises:
    a capacitor and a resistor formed in series and coupled between the first positive power line and the first negative power line; and
    a P-type MOSFET, a gate terminal of the P-type MOSFET being coupled to a node between the capacitor and the resistor; a source terminal of the P-type MOSFET being coupled to the first positive power line; a drain terminal of the P-type MOSFET being coupled to and used for triggering the discharging unit.

2. The ESD protection circuit of claim 1, wherein the second power domain has a second positive power line and a second negative power line, a first circuit is in the first power domain, a second circuit is in the second power domain, and the discharging unit comprises:
    a resistor;
    a first N-type MOSFET, a drain terminal of the first N-type MOSFET being coupled to a connection node for connecting the first circuit and the second circuit; a gate terminal of the first N-type MOSFET being coupled to the drain terminal of the P-type MOSFET; a source terminal of the first N-type MOSFET being coupled to the second negative power line; and
    a second N-type MOSFET, a drain terminal of the second N-type MOSFET being coupled to the drain terminal of the P-type MOSFET; a gate terminal of the second N-type MOSFET being coupled to the second positive power line via the resistor; a source terminal of the second N-type MOSFET being coupled to the second negative power line.

3. An electrostatic discharge (ESD) protection circuit, comprising:
    a detection unit configured in a first power domain; and
    a discharging unit configured in a second power domain and coupled to the detection unit, the discharging unit being turned off during normal power operations and triggered by the detection unit in an ESD event,
    wherein the first power domain has a first positive power line and a first negative power line, and the detection unit comprises:
    a capacitor and a resistor formed in series and coupled between the first positive power line and the first negative power line; and
    a triggering component, having a positive power end coupled to the first positive power line and a negative power end coupled to the first negative power line, an input of the triggering component being coupled to a node between the capacitor and the resistor, and an output of the triggering component being coupled to and used for triggering the discharging unit.

4. The ESD protection circuit of claim 3, wherein the triggering component is an inverter, an M-input NAND with all inputs coupled together, or an N-input NOR with all inputs coupled together; M and N are positive integers larger than 1, respectively.

5. The ESD protection circuit of claim 3, wherein the second power domain has a second negative power line, a first circuit is in the first power domain, a second circuit is in the second power domain, and the discharging unit is an N-type MOSFET; a drain terminal of the N-type MOSFET is coupled to a connection node for connecting the first circuit and the second circuit; a gate terminal of the N-type MOSFET is coupled to the output of the triggering component; a source terminal of the N-type MOSFET is coupled to the second negative power line.

6. The ESD protection circuit of claim 3, wherein the second power domain has a second negative power line, a first circuit is in the first power domain, a second circuit is in the second power domain, and the discharging unit is an N-type MOSFET; a drain terminal of the N-type MOSFET is coupled to a connection node for connecting the first circuit and the second circuit; a body terminal of the N-type MOSFET is coupled to the output of the triggering component; a gate terminal of the N-type MOSFET is coupled to the second negative power line via a resistor; a source terminal of the N-type MOSFET is coupled to the second negative power line.

7. The ESD protection circuit of claim 3, wherein the discharging unit is an NPN BJT or a P-type substrate-triggered SCR.

8. An electrostatic discharge (ESD) protection circuit, comprising:
    a detection unit configured in a first power domain; and
    a discharging unit configured in a second power domain and coupled to the detection unit, the discharging unit being turned off during normal power operations and triggered by the detection unit in an ESD event,
    wherein the first power domain has a first positive power line and a first negative power line, the second power domain has a second negative power line, a first circuit is in the first power domain, a second circuit is in the second power domain, the detection unit comprises:

a capacitor and a resistor formed in series and coupled between the first positive power line and the first negative power line; and the discharging unit comprises:

a P-type MOSFET, a source terminal of the P-type MOSFET being coupled to a connection node for connecting the first circuit and the second circuit; a gate terminal of the P-type MOSFET being coupled to a node between the capacitor and the resistor; a drain terminal of the P-type MOSFET being coupled to the second negative power line.

9. An electrostatic discharge (ESD) protection circuit, comprising:

a detection unit configured in a first power domain; and a discharging unit configured in a second power domain and coupled to the detection unit, the discharging unit being turned off during normal power operations and triggered by the detection unit in an ESD event, wherein the first power domain has a first positive power line and a first negative power line, the second power domain has a second positive power line and a second negative power line, a first circuit is in the first power domain, a second circuit is in the second power domain, the detection unit comprises:

a capacitor and a first resistor formed in series and coupled between the first positive power line and the first negative power line; and the discharging unit comprises:

a second resistor; and a P-type MOSFET, a source terminal of the P-type MOSFET being coupled to a connection node for connecting the first circuit and the second circuit; a gate terminal of the P-type MOSFET being coupled to the second positive power line via the second resistor; a body terminal of the P-type MOSFET being coupled to a node between the capacitor and the first resistor; a drain terminal of the P-type MOSFET being coupled to the second negative power line.

* * * * *